United States Patent [19]

Hagiawara

[11] Patent Number: 5,450,419
[45] Date of Patent: *Sep. 12, 1995

[54] ERROR CHECKING APPARATUS AND METHOD FOR A SERIAL SIGNAL TRANSMISSION SYSTEM

[75] Inventor: Masao Hagiawara, Hiratsuka, Japan

[73] Assignee: Kabushiki Kaisha Komatsu Seisakusho, Japan

[*] Notice: The portion of the term of this patent subsequent to Dec. 8, 2009 has been disclaimed.

[21] Appl. No.: 672,482

[22] Filed: Mar. 20, 1991

[51] Int. Cl.⁶ ............................................. G06F 11/10
[52] U.S. Cl. ........................................................ 371/30
[58] Field of Search ................................ 371/37.1, 30

[56] References Cited

U.S. PATENT DOCUMENTS 4,879,714  11/1989  Maeno ............................. 370/85.7
5,105,426   4/1992  Hagiwara ........................... 371/20.1
5,170,338  12/1992  Moritoki et al. ................... 371/20.1

Primary Examiner—Charles E. Atkinson
Attorney, Agent, or Firm—Welsh & Katz, Ltd.

[57] ABSTRACT

In an error checking apparatus for a serial signal transmission system comprising a plurality of nodes in a centralized control system of various devices such as presses, machine tools, constructing machines, ships, airplanes, unattended conveyer systems and unattended warehouses, plural types of error check codes are added to serial transmission data for each node. The node checks the received data for each of the received error check codes, adds error codes indicative of the result of the error check to the respective error check codes and sends them to a downstream node and a main controller.

11 Claims, 4 Drawing Sheets

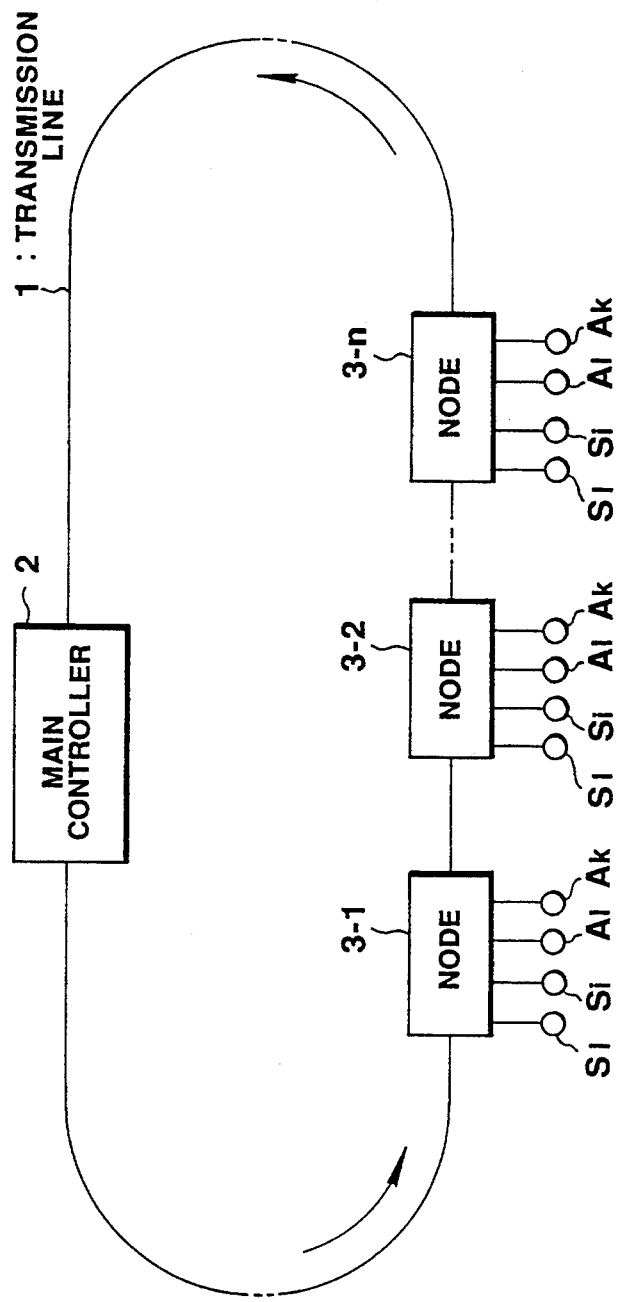

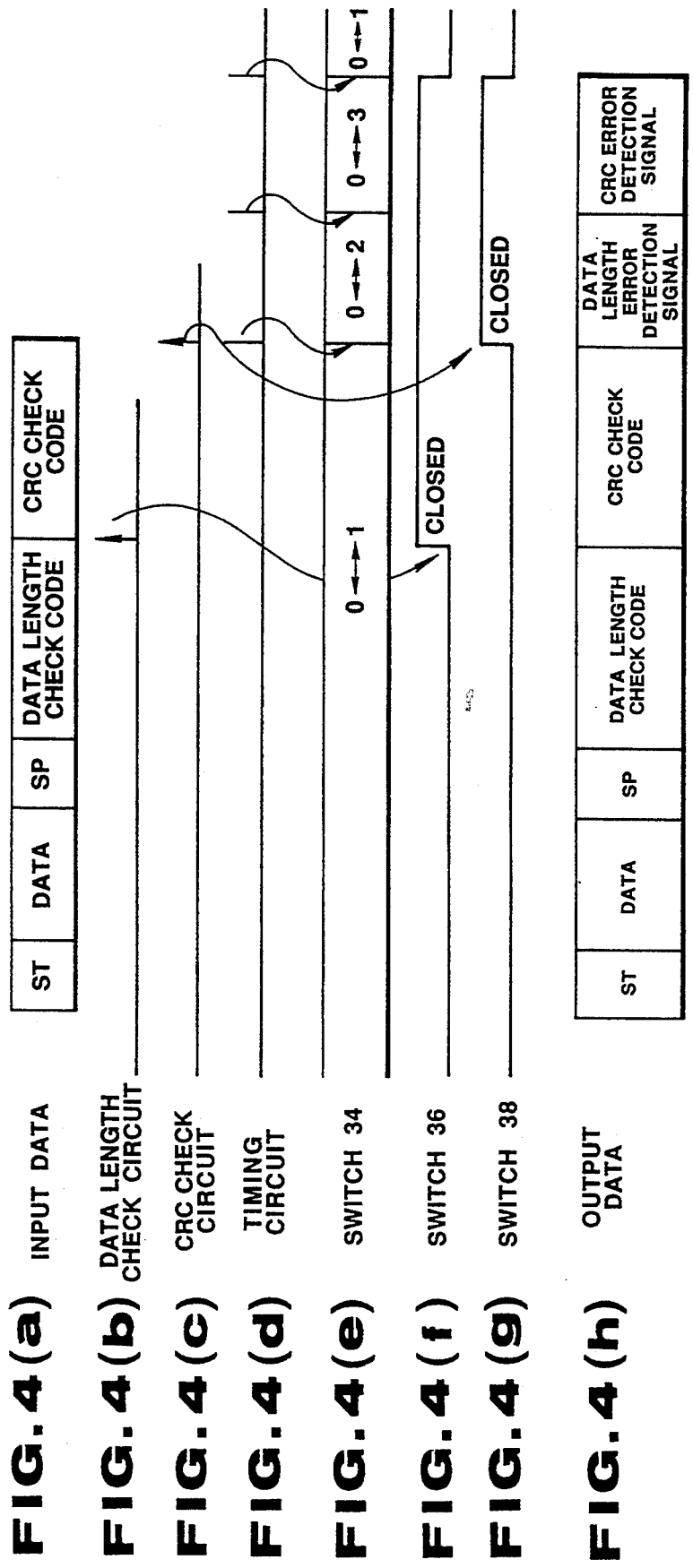

|   | B7 | B6 | B5 | B4 | B3 | B2 | B1 | B0 |
|---|----|----|----|----|----|----|----|----|
| FIG. 5(a) NO ERRORS | 0 | 0 | 0 | 0 | 0 | 0 | 0 | 0 |
| FIG. 5(b) DATA LENGTH ERROR | 1 | 1 | 1 | 1 | 1 | 1 | 0 | 0 |
| FIG. 5(c) CRC ERROR | 1 | 1 | 1 | 1 | 0 | 0 | 1 | 1 |
| FIG. 5(d) CRC ERROR & DATA LENGTH ERROR | 1 | 1 | 1 | 1 | 1 | 1 | 1 | 1 |

ERROR CHECKING APPARATUS AND METHOD FOR A SERIAL SIGNAL TRANSMISSION SYSTEM

BACKGROUND OF THE INVENTION

1. Field of the Invention

This invention relates to method and apparatus for checking errors in a serial signal transmission system used in a centralized control system for various devices such as presses, machine tools, constructing machines, ships and airplanes as well as unattended conveyer systems and unattended warehouses.

2. Description of the Related Art

In order to control such devices as mentioned above in a centralized manner, a great number of sensors are required for sensing the states of each part of the device and a great number of actuators for-controlling the respective states of the device. The number of sensors and actuators is 3,000 or more in a typical press machine, and even more sensors and actuators are required in other devices. Other related apparatus are described in U.S. Pat. Nos. 5,105,426 and 5,170,338.

In a conventional system for controlling such devices in a centralized manner, there is provided a main controller to which a great number of sensors and actuators are connected. The main controller receives the outputs from the sensors and controls the actuators in accordance with signals from the sensors. When the number of sensors and the number of actuators are great, the number of lead cables connecting the main controller to the sensors and actuators are accordingly great and the structure of the input/output units of the main controller can be very complicated.

A construction has been proposed in which there are provided a plurality of nodes, each of which one or more sensors and actuators are connected to, and these nodes are connected to each other in ring or in series through the main controller such that each node is controlled by signals from the main controller. In such an arrangement, only a signal input line and a signal output line are required to be connected to the main controller and to each node. As a result, the number of lead cables is greatly reduced.

However, in the above-discussed construction, the problem arises how to ensure simultaneous input of the respective sensor outputs and simultaneous control of the respective actuators. To code with the problem, an arrangement has been proposed in which an address is allocated to each node to control each node in accordance with the address. However, there arises another problem of time lag caused by the address processing As a result, simultaneous input of the respective sensor outputs and simultaneous control of the respective actuators cannot be ensured satisfactorily.

In view of the foregoing, the inventors discarded the idea of allocating an address to each node connected to each other in series, and have proposed a series control apparatus in which each node is identified by the sequence (order) of the series connection, to thereby make address processing unnecessary, to eliminate a time lag due to the address processing and to greatly simplify the structure of the nodes.

According to the arrangement of the series control apparatus, each node sequentially adds the output signal of the sensor in the node to a signal from the upstream node in accordance with a predetermined rule, sequentially extracts a signal for the node from the upstream node in accordance with a predetermined rule, and outputs the extracted signal to an actuator in the node. In this apparatus, each node requires no address to thereby make address processing unnecessary. Time lag in each node is generated only during timing operation and therefore is reduced to a very small one, which greatly simplifies the structure of the nodes.

In the above arrangement, the main controller transmits a time series train of serial signals including an error check code such as horizontal and vertical parity check codes or a CRC (Cyclic Redundancy Check) code. Each node checks errors in the received signals by using the error check code. If there is an error involved, each node transmits a signal indicative of the error to the main controller through a downstream node, to thereby prevent a wrong operation of the system due to the transmission error.

However, in the conventional arrangements, when a plurality of error check codes such as horizontal and vertical parity check codes are added, signals resulting from error checking are collected together as a single signal and sent back to the main controller. Thus, the main controller cannot recognize the specific types of errors and therefore cannot cope with each type of error properly.

SUMMARY OF THE INVENTION

It is an object of the present invention to provide method and apparatus and method for checking errors in a serial signal transmission system capable of judging the result of error checking for each error check code and taking proper sheds against each type of error.

The object of the present invention is achieved by an apparatus for checking errors in a serial signal transmission system which transmits a serial signal frame with plural types of error check codes to a plurality of nodes connected in series, each of the nodes comprising error checking means for checking plural types of errors on the basis of the plural types of error check codes; error code generating means for generating a plurality of error codes corresponding to the plural types of error check codes in accordance with output of the error checking means; and adding means for adding the plurality of error codes generated by said generating means to the serial signal frame.

According to the present invention, the main controller transmits serial data to which plural types of error check codes are added for the respective nodes. Each node checks transmission errors in the received data for each received error check code and sends the result of error check together with the error check codes to downstream nodes and to the main controller.

Since each node checks the received data for each error check code, and sends the resulting data with each error check code back ho the main controller, the main controller can know the result for each error check code and take proper sheds for the results. Thus, wrong operation of the system can be prevented beforehand.

BRIEF DESCRIPTION OF THE DRAWINGS

FIG. 1 illustrates a configuration of one embodiment of the entire structure of a serial signal transmission system to which the present invention is applied;

FIG. 2, comprised of FIGS. 2(*a*) and 2(*b*), illustrates an example of a frame structure of a serial communication data;

FIG. 4, comprised of FIGS. 4(a)–4(h), is a timing chart indicative of the operations of each element of the node; and FIG. 5, comprised of FIGS. 5(a)–5(d), illustrates an example of the structure of an error check detection signal.

DESCRIPTION OF THE PREFERRED EMBODIMENTS

Figure 3:
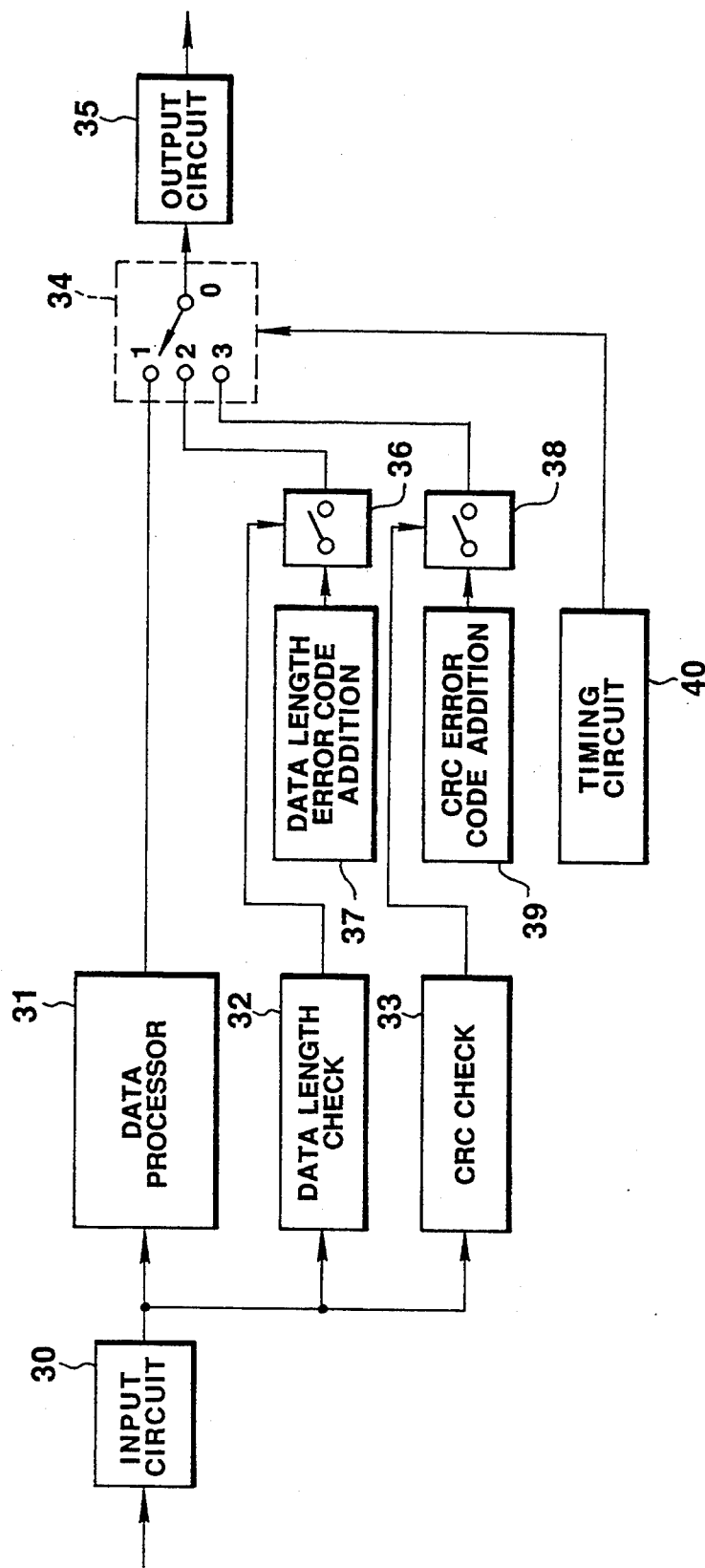
FIG. 3 is a block diagram of one embodiment of a node.

FIG. 1 is a schematic of a embodiment of the present invention which includes a ring transmission line 1 to which a main controller 2 and n nodes 3-1 to 3-n, each node having a plurality of sensors S1–Si and actuators A1–Ak are connected.

Main controller 2 sends to transmission 1 communication data comprising a start code ST at its head, control data DATA for the respective nodes, a shod code SP indicative of the end of the data, and a final plurality of kinds of error check codes ERC-1, ERC-2 such as parity check codes and CRC codes as shown in FIG. 2(a). Useful error check codes may be found in U.S. Pat. No. 5,170,338. The communication data is transmitted in series through transmission line 1 to respective nodes 3-1 to 3-n.

When each of nodes 3-1 to 3-n receives communication data from transmission line 1, it extracts control data in a time slot corresponding to the connection number of that node and checks the received data DATA for errors with error check code ERC-1, ERC-2. If no errors are involved, the node controls actuators A1–Ak using that control data. It inserts the output signals from S1–Si into the time slot corresponding to the connection number of that node and sends it to a downstream node.

Therefore, control data DATA sent by main controller 2 is changed to the sensor output signals of the nodes when the most downstream node 3-n sends its sensor output signals. Main controller 2 recognizes the respective states of nodes 3-1 to 3-n in accordance with those sensor outputs and proceeds to the next control step. If each node recognizes the occurrence of an error as the result of error checking using any one of the error check codes, it employs no control data DATA, but adds data ERD-1, ERD-2 (indicative of the presence/absence of an error involved) obtained as the result of error checking for the respective error check codes to the end of error check codes ERC-1, ERC-2 as shown in FIG. 2(b), and sends them to the main controller 2 through the downstream nodes.

FIG. 3 is a schematic of one embodiment of the internal structure of nodes 3-1 to 3-n and using two kinds of data length check codes (ERC-1) and a CRC code (ERC-2) as error check codes ERC-1, ERC-2. In FIG. 3, communication data from an upstream node is received by an input circuit 30 which decodes the data to an NRZ code when the input circuit 30 modulates and sends the data. The decoded communication data is input to data processor 31 (including the function of generating an error check code), data length check circuit 32 and CRC circuit 33.

Data processor 31 extracts only control data DATA for the node to which the data processor 31 belongs among control data DATA for all the nodes contained in the decoded control data, inserts the output signals from sensors S1–Sn into a time slot for that node, prepares error check codes ERC-1, ERC-2 for the contents of new communication data DATA in which the outputs signals of sensors S1–Sn are inserted, adds the error check codes ERC-1, ERC-2 after the data DATA and sends them. The signals having a frame structure shown in FIG. 2(b) output from the data processor 31 are input through switch 34 to output circuit 35 where they are modulated and sent to the downstream nodes.

Control data DATA for the particular node extracted by data processor 31 belonging to that node is input to an actuator driver (not shown) which drives actuators A1–Ak in accordance with that data.

Data length check circuit 32 checks the length of received control data DATA using data length check code ERC-1. If there is an error in the data length, it closes switch 36 and inputs a data length error detection signal ERD-1 output from data length error code addition circuit 37 to a changeover position input "2" of switch 34.

CRC circuit 33 checks received control data DATA for cyclic redundancies using CRC code ERC-2. If there is an error in the CRC code, it closes switch 38 and inputs CRC error detection signal ERD-2 output from CRC error code addition circuit 39 to a changeover position input "3" of switch 34.

As shown in a timing chart of FIG. 4, switch 34 switches its switched contacts to the respective "1"–"3" positions in accordance with a timing signal from timing circuit 40 and inputs signals collected at the respective changeover positions to output circuit 35.

Therefore, when the changed position is at "2", data length error detection signal ERD-1 output from data length error code addition circuit 37 is input to output circuit 35 through switch 34 if switch 36 is closed as shown in FIG. 4(f), and data length error detection signal ERD-1 is added after data length check code ERC-1 and sent together with ERC-1, as shown by the output signals in FIG. 4(h) from output circuit 35.

When the changeover setting position of switch 34 is at "3", CRC error detection signal ERD-2 is input to output circuit 35 through switch 34 if switch 38 is closed as shown in FIG. 4(g), and CRC error detection signal ERD-2 is added after data length error detection signal ERD-1 and sent.

Assume that error detection signal ERD-1, ERD-2 each is composed of a signal, for example, of 8 bits, the 4 bits of which represent the kind of an error and the remaining 4 bits represent the presence/absence of an error. FIG. 5 shows one example of the contents of error detection signals ERD-1, ERD-2. If all the 8 bits of B7–B0 are "0", it is meant that there is no error involved. If B7–B4 are "1", it is meant that a data length error or a CRC error has occurred. If B3, B2 are "1", it is meant that a data length error has occurred. If B1, B0 are "1", it is meant that CRC error has occurred.

If all of B7–B0 is "1", it is meant that both of a CRC error and a data length error have occurred simultaneously.

Therefore, main controller 2 can determine whether an error has occurred and what kind of error has occurred depending on the contents of error detection signals ERD-1, ERD-2 of 8 bits, and can take appropriate measures thereagainst.

While the internal structure of main controller 2 is not shown, it is to be noted that it has the function of adding a data length check code ERC-1 and a CRC check code ERC-2 to control data DATA for the respective nodes and sends them to those nodes.

While in the above embodiment the data length check code and CRC code are employed, other error check codes may be employed and even more error check codes may be added for error checking purposes.

What is claimed is:

1. An apparatus for checking errors in a serial signal transmission system which transmits a serial signal frame with plural types of error check codes to a plurality of nodes connected in series, each of the nodes comprising:

error checking means for checking plural types of errors on the basis of the plural types of error check codes;

error code generating means for generating a plurality of error codes corresponding to the plural types of error check codes in accordance with output of the error checking means; and adding means for adding the plurality of error codes generated by said generating means to the serial signal frame.

2. The error check apparatus according to claim 1, wherein the plural types of error check codes comprise a data length check code for checking data length of the serial signal frame and a CRC check code for CRC check.

3. The error check apparatus according to claim 2, wherein the error checking means comprises:

data length checking means for checking the data length of the serial signal frame on the basis of the data length check code; and CRC checking means for performing the CRC of the serial signal frame on the basis of the CRC code.

4. The error check apparatus according to claim 3, wherein the adding means comprises:

means for adding a data length error code to the serial signal frame in accordance with output of said data length checking means; and means for adding a CRC error code to the serial signal frame in accordance with output of said CRC checking means.

5. The error check apparatus according to claim 1, wherein the error code generating means generates the error code comprising a digital serial signal of plural bits, the former half of which indicates the presence/absence of an error while the latter half of which indicates type of the error.

6. The error check apparatus according to claim 5, wherein the error code generating means generates the error code comprising a digital serial signal of plural bits, the former half of which indicates the presence of an error when all bits therein are 1 while the latter half of which indicates type of the error according to position of a bit which is 1.

7. The error check apparatus according to claim 1, wherein each of the nodes further comprises means for extracting data regarding said each of the nodes from the data of the serial signal frame so as to control a terminal connected to said each of the nodes, inserting the output data of the terminal into a time slot of the serial signal frame corresponding to said each of the nodes and sending the output data to a downstream node.

8. The error check apparatus according to claim 7, wherein the terminal comprises a sensor and an actuator.

9. The error check apparatus according to claim 1, further comprising a main controller for connecting the serially-connected nodes in a form of a ring and for generating the serial signal frame to which the plural types of error check codes are added.

10. The error check apparatus according to claim 1, wherein the serial signal frame to which the plural types of error check codes are added comprises a start code indicative of start of data, data, a stop code indicative of end of the data, and a plural types of error check codes connected in series in a frame.

11. A method of checking errors in a serial signal transmission system for transmitting a serial signal frame to which plural types of error codes are added through a plurality of nodes connected in a serial manner, comprising in each of the plurality of the nodes the steps of:

checking errors of plural types based on plural types of error check codes;

generating a plurality of error codes corresponding to the plural types of error check codes in accordance with results of the error checking; and adding the plurality of error codes to the serial signal frame.

* * * * *